United States Patent [19]
Deleonibus

[11] Patent Number: 6,091,076
[45] Date of Patent: Jul. 18, 2000

[54] QUANTUM WELL MOS TRANSISTOR AND METHODS FOR MAKING SAME

[75] Inventor: Simon Deleonibus, Claix, France

[73] Assignee: Commissariat a l'Energie Atomique, Paris, France

[21] Appl. No.: 09/011,626

[22] PCT Filed: Jun. 13, 1997

[86] PCT No.: PCT/FR97/01075

§ 371 Date: Feb. 12, 1998

§ 102(e) Date: Feb. 12, 1998

[87] PCT Pub. No.: WO97/48135

PCT Pub. Date: Dec. 18, 1997

[30] Foreign Application Priority Data

Jun. 14, 1996 [FR] France ................................ 96 07444

[51] Int. Cl.[7] ...................... H01L 29/06; H01L 31/0328; H01L 31/0336
[52] U.S. Cl. ................ 257/24; 257/25; 257/27; 257/401; 257/408
[58] Field of Search ............... 257/408, 24, 25, 257/27, 401

[56] References Cited

U.S. PATENT DOCUMENTS

| | | | |
|---|---|---|---|
| 4,712,122 | 12/1987 | Nishizawa et al. | 357/22 |
| 5,198,879 | 3/1993 | Ohshima | 257/20 |
| 5,608,231 | 3/1997 | Ugajin et al. | 257/24 |
| 5,731,598 | 3/1998 | Kado et al. | 257/30 |
| 5,783,840 | 7/1998 | Randall et al. | 257/24 |
| 5,796,119 | 8/1998 | Seabaugh | 257/25 |
| 5,831,294 | 11/1998 | Ugajin | 257/191 |

*Primary Examiner*—William Mintel
*Attorney, Agent, or Firm*—Hayes Soloway Hennessey Grossman & Hage PC

[57] ABSTRACT

A new quantum well MOS transistor is described along with a processes for manufacturing it. In this transistor, the source and drain areas are separated from the channel by sufficiently thin insulating layers to enable the passage of charge carriers by the tunnel effect. Each of the source and drain areas is separated from the substrate by an electrically insulating layer that is sufficiently thick to prevent charge carriers from passing through this insulating layer.

18 Claims, 8 Drawing Sheets

QUANTUM WELL MOS TRANSISTOR AND METHODS FOR MAKING SAME

TECHNICAL FIELD

This invention relates to a MOS (Metal-Oxide-Semiconductor) quantum well transistor and processes for manufacturing it.

It has applications in microelectronics for manufacturing various devices, for example such as digital inverters that use MOS transistors complementary to each other.

STATE OF PRIOR ART

FIG. 1 shows a schematic cross-sectional view of a conventional MOS transistor at the end of the integration process of forming this transistor.

The transistor in FIG. 1 comprises a p type silicon substrate 2.

Two areas 4 and 6 separated from each other are formed on this substrate 2.

These areas 4 and 6 are $n^+$ type diffused areas forming the transistor source and drain.

As can be seen in FIG. 1, areas 4 and 6 are prolonged by areas 8 and 10 respectively, which are type $n^-$ diffused areas (less doped than areas 4 and 6).

Areas 8 and 10 form extensions to the source and drain areas under the transistor grid that will be considered later.

The transistor in FIG. 1 also comprises two areas 12 and 14 that extend above areas 4 and 6 respectively, at approximately the same level as areas 8 and 10 (which face each other and are only separated from each other by a small p type silicon interval).

These areas 12 and 14 are made from a metal silicide and are self-aligned with the transistor grid and with the field insulation areas in this transistor, which will be considered later.

Areas 12 and 14 form the metallizations-shunts of the transistor source and drain.

Above the p type silicon area 16 separating areas 8 and 10 from each other, there is an electrically insulating layer 18 made of silica which also extends above these areas 8 and 10 and which forms the transistor grid insulation.

There is a layer 20 of polycrystalline silicon above layer 18.

There is a layer 22 above this layer 20, made of a metal silicide and forming a metallization-shunt.

The transistor grid is formed by these two layers 20 and 22.

Furthermore, two electrically insulating spacers 24 and 26, for example made of silica or silicon nitride, extend on each side of the stack formed by the layers 20 and 22 until the grid insulation 18.

The transistor shown in FIG. 1 is electrically insulated from other identical transistors (not shown) also formed on substrate 2 by means of LOCOS type field insulation areas 28 and 30.

The entire structure thus obtained is covered by an insulating layer 32 made of silica glass doped with phosphorus and boron.

Two openings pass entirely through this layer 32 and open up into areas 12 and 14 respectively.

These two openings are filled with a metal by chemical vapor deposition and form the source and drain contacts 34 and 36 respectively.

The transistor in FIG. 1 also comprises two metallic interconnection layers 38 and 40 located on the surface of the layer 32 and prolong contacts 34 and 36 respectively.

The grid contact is not shown in FIG. 1.

FIG. 2 is a schematic cross-sectional view of another conventional MOS transistor.

It is a MOS transistor on SOI (Silicon On Insulator), shown at the end of its integration process.

The transistor in FIG. 2 is different from the transistor in FIG. 1 in that layers 4 and 6 are much thinner, and that these layers 4 and 6 and the silicon area 42 between these layers are supported on a thick layer 44 of buried silica that is itself supported on a silicon substrate 46.

Another quantum dot MOS transistor is known in the following reference document:

(1) Silicon single hole quantum dot transistor for complementary digital circuits, E. Leobandung, L. Guo and S. Y. Chou, IEDM 95, p 367 to 370.

In this transistor described in document (1), the grid is added on after the source and drain areas are made.

The size of this known transistor is such that its electrical behavior is not entirely related to the behavior of the quantum well included in this transistor.

In fact, this known transistor comprises a channel with small dimensions between the transistor source and drain, but the grid added onto the source and drain is large in proportion.

This is a disadvantage when it is required to increase the integration rate of this type of transistor.

DESCRIPTION OF THE INVENTION

The purpose of this invention is a quantum well MOS transistor and the processes for manufacturing this transistor which overcome the disadvantage mentioned above.

These processes are capable of aligning transistor source and drain areas on the grid of this transistor by selective etching.

Specifically, the first purpose of this invention is a MOS type transistor comprising:

a semiconductor substrate, a grid area, a semiconductor channel located under the grid area and electrically insulated from it, and a source area and a drain area that are located on each side of the grid area and the channel and which are electrically insulated from the substrate and the grid area, this transistor being characterized in that the source and drain areas are separated from the channel by electrically insulating layers that are sufficiently thin to enable charge carriers to pass by means of the tunnel effect from the source area to the drain area through the channel, and in that each of the source and drain areas is separated from the substrate by an electrically insulating layer sufficiently thick to prevent the passage of charge carriers through this insulating layer.

Preferably, each source and drain area is made of a metallic material, which minimizes electrical resistances to access the transistor.

These access resistances are also minimized by the fact that part of the source area and part of the drain area are located under the transistor grid area.

According to a first particular embodiment of the transistor according to the invention, the channel is electrically insulated from the substrate.

According to a second particular embodiment, the channel is in electrical contact with the substrate through a narrow area in this substrate.

According to a preferred embodiment of the transistor according to the invention, the substrate and the channel are made of silicon.

In this case, the sufficiently thin insulating layers may be made of silica or silicon nitride.

The insulating layer that separates each source and drain area may be a silica layer, the transistor thus having a structure of a type that can be referred to as pseudo-SOI.

In a particular embodiment of the invention, the source area, the drain area and the channel are separated from the substrate by a very thick electrically insulating layer that may be made of silica, the transistor thus having a SOI (Silicon On Insulator) type structure.

Another purpose of this invention is a process for manufacturing the transistor according to the invention, this process being characterized in that it comprises the following steps:

- a structure is formed comprising the substrate, the active area and two field insulation areas on each side of the active area, and the grid area,
- two recesses are formed in the substrate, one between one of the field insulation areas and the grid area, and the other between this grid area and the other field insulation area, the flanks of the recesses closest to the grid area being located under the grid area,
- the sufficiently thin layers are formed on the flanks and the sufficiently thick insulating layers are formed at the bottom of recesses, and
- the source and drain areas are formed in the recesses.

An "active area" refers to the area in which the source, drain and the channel region located under the grid will be formed.

According to a first particular embodiment of this process when the substrate is made of silicon and the sufficiently thick layers are made of silica, the sufficiently thin insulating areas are formed first and the silica layers are then formed by doping substrate areas at the bottom of recesses by impurities enabling fast oxidation of the substrate and then oxidizing the areas thus doped.

In this case, the sufficiently thin insulating layers may be made of silica or silicon nitride.

According to-a second particular embodiment of this process when the substrate is made of silicon and the sufficiently thick layers are made of silica, the sufficiently thin insulating layers and the silica layers are formed by depositing silicon nitride in the recesses, the nitride thus deposited is eliminated except on the flanks so as to form the said sufficiently thin insulating layers, and the substrate areas at the bottom of the recesses are oxidized so as to form the silica layers.

As a variant when the substrate is made of silicon and the sufficiently thick layers are made of silica, the sufficiently thin insulating layers and the silica layers can be formed by depositing silicon nitride in the recesses, eliminating the nitride thus deposited except on the flanks, and then oxidizing the substrate areas at the bottom of the recesses so as to form the silica layers, then eliminating the nitride from the flanks and oxidizing these flanks so as to form the sufficiently thin insulating layers.

Another purpose of this invention is another process for manufacturing the transistor according to the invention comprising the very thick layer, this said process being characterized in that it comprises the following steps:

- a structure is formed comprising the substrate, the very thick insulating layer (for example made of silica), a semiconductor layer (for example made of silicon) above this layer, the active area and two field insulation areas on each side of the active area, and the grid area,
- two recesses are formed in the semiconductor layer, one between one of the field insulation areas and the grid area, and the other between the grid area and the other field insulation area, the flanks of the recesses closest to the grid area being located under the grid area,
- the sufficiently thin layers are formed on the said flanks, and
- the source and the drain areas are formed in the recesses.

In this case, a silicon substrate and a very thick silica layer may be used, and the sufficiently thin insulating layers may also be made of silica or silicon nitride.

In this case also, a silicon substrate and a very thick layer of silica can be used, and the sufficiently thin insulating layers can be formed by depositing silicon nitride in the recesses and eliminating the nitride thus deposited, except on the flanks.

As will become more obvious later in this description, when the pseudo-SOI type structure of the transistor channel in this invention is short, the insulator above which the source area is located and the insulator above which the drain area is located may be contiguous.

This then delimits a confined volume of silicon that may act as a quantum well.

The transistor is then capable of operating in quantum conditions.

In a transistor operating under conventional (non-quantum) conditions, charge carriers are transported in an inversion layer at the interface between the grid insulator and the transistor substrate.

There is a continuum of allowed states in this inversion layer.

In a transistor according to the invention operating in quantum conditions, an inversion layer is obtained with discontinuous allowed states.

Note that a transistor operates in quantum conditions when the energy difference between two allowed levels is approximately equal to the thermal agitation energy of the electrons or exceeds this thermal agitation energy.

For a quantum well, the active part is very small with respect to the average free path of an electron.

BRIEF DESCRIPTION OF THE DRAWINGS

This invention will be better understood by reading the following example embodiments, given solely for information and in no way restrictive, with reference to the attached drawings in which.

DETAILED DESCRIPTION OF PARTICULAR EMBODIMENTS

MOS transistors conform with the invention, for which the manufacture is explained with reference to FIGS. 3 to 23, vary in length from a few nanometers to several micrometers.

When the length of this type of MOS transistor reaches a few nanometers, the operation is modified by the possibility of a direct transfer from the source to the drain (ballistic effect) and by doping fluctuations in the channel.

These two parameters are particularly critical when the number of charge carriers involved is low.

This invention is capable of:
controlling ballistic effects by the use of MIS (metal-insulator-semiconductor) type structures using a tunnel effect, and
making a quantum well between the source and drain of a MOS transistor, enabling coulombian blocking of charge carriers, thus enabling very high performance quasi single carrier operation or entirely single carrier operation for this transistor.

Furthermore, in the case in FIGS. 3 to 9, the invention applied to making MOS transistors with a pseudo-SOI structure can:
reduce leaks at junctions to practically zero, provide good insulation and significantly reduce the "$n^+/p^+$" distance as in the case of SOI type devices, and
very much reduce the capacitances of drain/substrate diodes.

This thus gives the advantages of SOI type devices for transistors made of a solid silicon substrate.

Furthermore, the transistors obtained may be very small, so that a coulombian blockage is possible for microelectronic devices in which these transistors are used.

Figure 1:
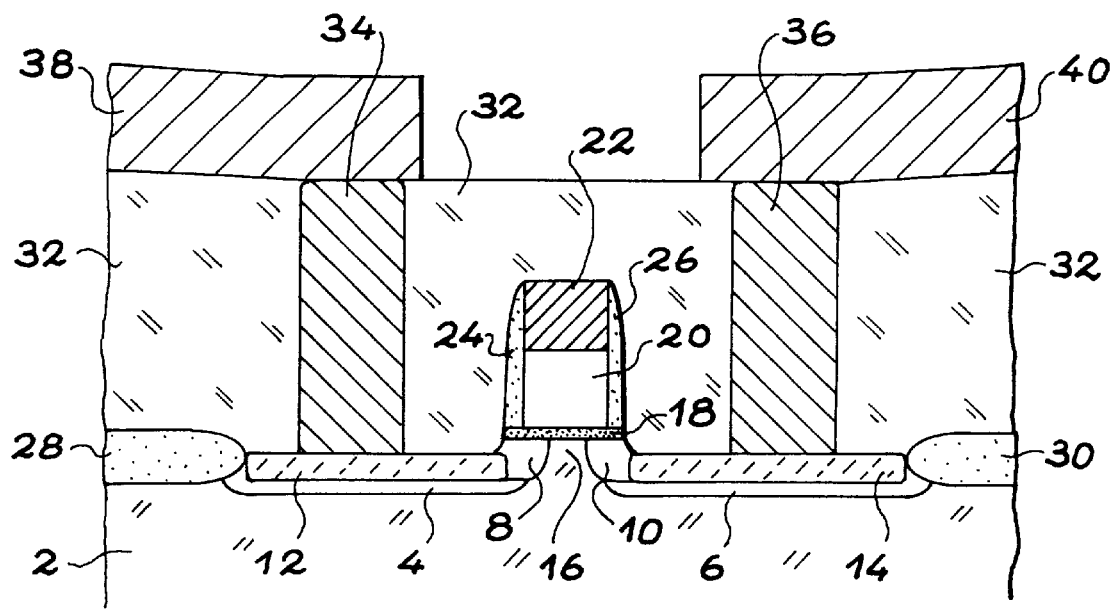
FIG. 1, already described, is a schematic cross-sectional view of a known MOS transistor formed on a solid semiconductor substrate, FIG. 2, already described, is a schematic cross-sectional view of another known MOS transistor with an SOI type structure, FIGS. 3 to 9 schematically illustrate the various steps in a process according to the invention, used to obtain a transistor with a pseudo-SOI type structure, FIGS. 10 to 14 schematically illustrate the steps in another process according to the invention, in order to obtain a transistor with an SOI type structure, FIGS. 15 to 22 schematically illustrate the steps of variants of the process illustrated by FIGS. 3 to 9, also used to obtain a transistor according to the invention with a pseudo-SOI type structure, and FIG. 23 schematically illustrates a step of a variant of the process illustrated by FIGS. 10 to 14, also used to obtain a transistor according to the invention with an SOI type structure.

The steps in a process according to the invention, which are schematically illustrated in FIGS. 3 to 9, can obtain a MOS transistor which should be compared with the transistor in FIG. 1.

In order to implement this process, the starting point is to form a structure comprising a solid substrate 50 made of a p type single crystalline silicon (FIG. 3), in a known manner.

This structure also comprises:
a silica insulating layer 52 or a grid oxide layer, which is in contact with the substrate 50,
a polycrystalline silicon layer 54 which is supported on layer 52,
a metallization-shunt 56 which is supported on layer 54, and
an insulating layer 58, for example made of silicon nitride, which is supported on the metallization-shunt 56.

The grid is composed of layers 54 and 56.

The structure also comprises two field insulation areas 60 and 62 that are placed on each side of the set of layers 52 to 58 and are made before this set of layers, for example using the "LOCOS" method.

Figure 3:
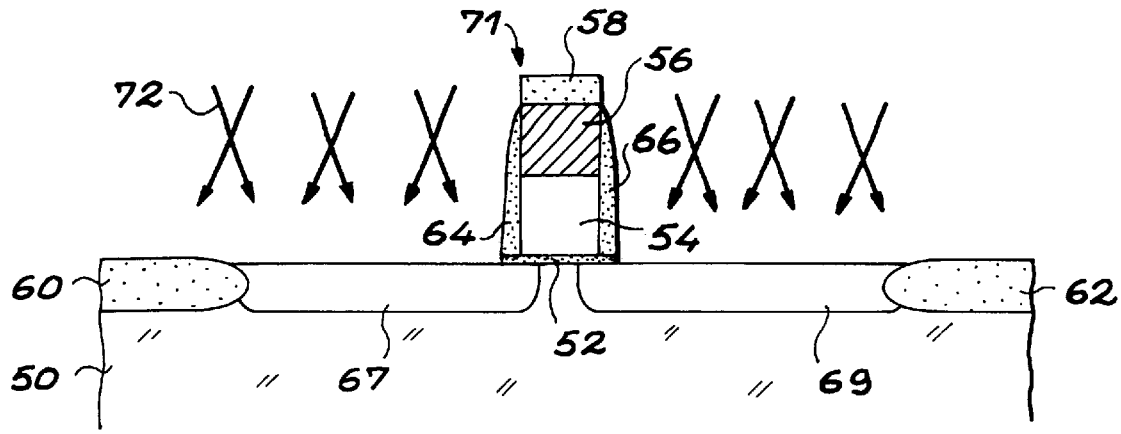

On this structure, the first step is to etch spacers 64 and 66 such that these spacers are supported on layer 52 and surround layers 54 and 56 as can be seen in FIG. 3.

The assembly 71 composed of layers 52 to 58 and spacers 64 and 66 may be called a "grid area".

Figure 4:
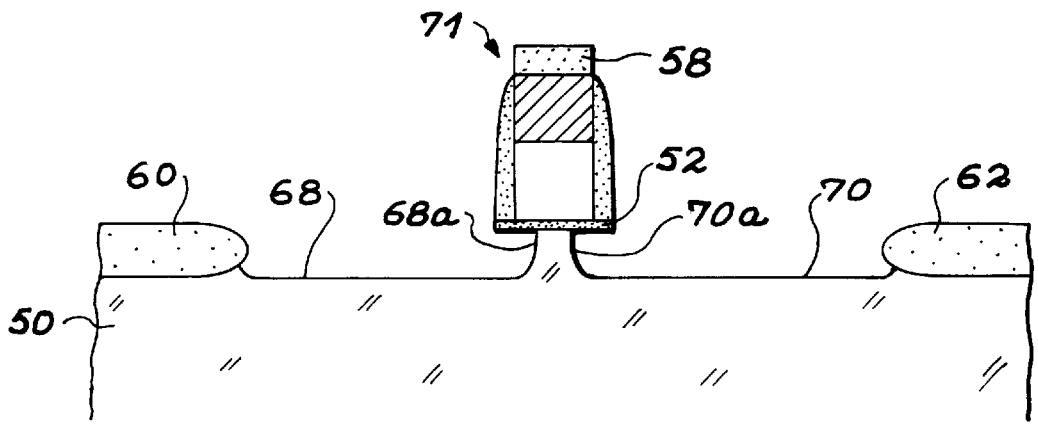

Two recesses 68 and 70 are then formed in the substrate 50 (FIG. 4).

The recess 68 is between the area 60 and the grid area and the recess 70 is between area 62 and this grid area.

These recesses 68 and 70 extend under the layer 52 as can be seen in FIG. 4.

In order to obtain these recesses 68 and 70, the isotropic silicon is etched selectively with respect to the grid and the field insulation, for an appropriate time.

However, in order to have better geometric control over the structure eventually obtained shown in FIG. 4, when making recesses 68 and 70 it is preferable to start by making a $p^+$ implantation in areas 67 and 69 (FIG. 3) in the substrate, these areas corresponding to the recesses 68 and 70 that are to be obtained.

This is done using a beam 72 of highly dosed boron ions, in order to obtain an average final concentration of $10^{19}$ to $10^{20}$ atoms per $cm^3$.

An implantation with an inclined and rotated substrate is made in order to overcome shadow effects due to the grid area.

An implantation annealing followed by a diffusion adjusts the final length of the transistor channel that is to be obtained.

The residual oxide of the source and drain is also eliminated; when the layer 52 is formed, silica is deposited everywhere between areas 60 and 62 and this silica is partially eliminated when etching the grid area and spacers 64 and 66; the implantation is done through the residual silica layer, and annealing then takes place and this layer is then eliminated as described above.

A selective etching of the $p^+$ silicon (areas 67 and 69) is then done with respect to the p type silicon in the substrate (in which there was no implantation).

This is done using an HF, $HNO_3$, $CH_3COOH$ type mix which is described in the following document, which should be referred to:

(2) Extremely high selective etching of porous Si for single etch-stop bond-and-etch-back SOI, K. Sakaguchi, N. Sato, K. Yamagata, Y. Fujiyama and T. Yonehara, Extended abstracts of the 1994 International conference on solid state devices and materials, Yokohama, 1994, p. 259 to 261.

This mix attacks the $p^+$ doped silicon with a selectivity equal to 100 with respect to the p type silicon.

A fast nitridation is then done on the exposed silicon, for example using ammonia gas which can give very thin layers 74 and 76 (FIG. 5) made of silicon nitride on flanks 68a and 70a of recesses 68 and 70, which are located under layer 52 and at the bottom of recesses.

Instead of carrying out this fast nitridation, a fast oxidation of the silicon can be done, which then leads to silica layers 74 and 76.

A high $n^+$ type dose of the substrate is then implanted at the bottom of recesses 58 and 70 through layers 74 and 76 at the bottom of recesses.

The nitride layer is destroyed by the $n^+$ implantation due to the high dose, except in locations protected by the shadow caused by the presence of the grid.

Figure 5:
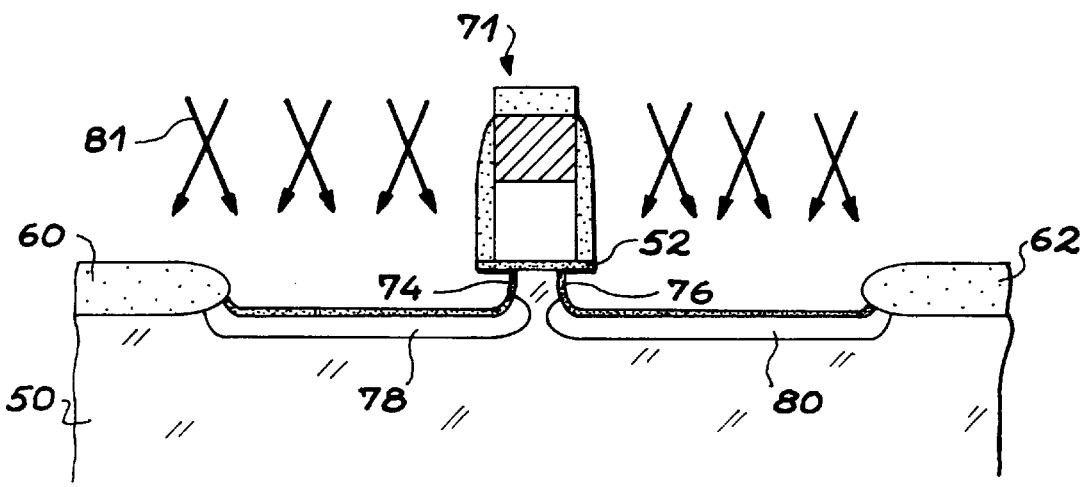

$n^+$ doping areas resulting from this implantation at the bottom of the recesses are marked as references 78 and 80 in FIG. 5.

This is done, for example using a beam 81 of arsenic or phosphorus ions.

The dose is chosen such that the doping of these areas 78 and 80 is of the order of $10^{19}$ to $10^{20}$ atoms per $cm^3$.

Furthermore, the implantation is done with the substrate inclined, such that selective doping is possible under layer 52 at the required depth.

Furthermore, rotation of the substrate during implantation eliminates the shadow due to the height of the active area of the grid.

After activating the doping agents, the implanted areas 78 and 80 are oxidized.

Figure 6:
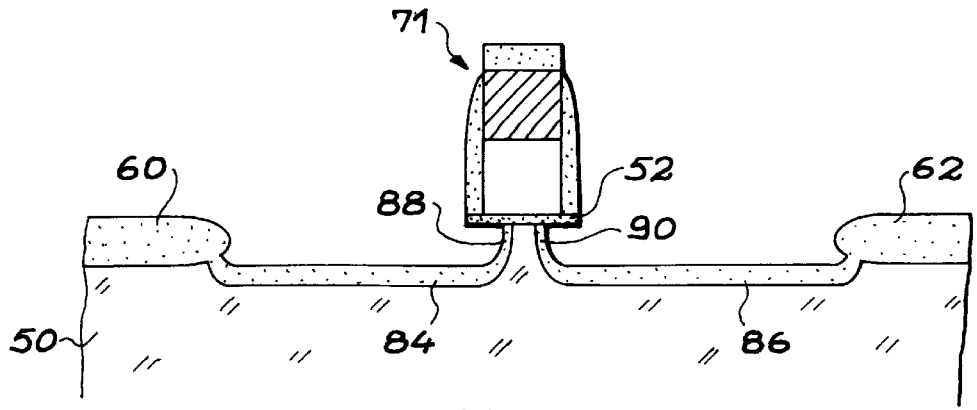

The silica layers resulting from this oxidation are marked as references 84 and 86 respectively in FIG. 6.

Note that this oxidation results in fast formation of these layers 84 and 86.

Note that oxidation takes place until the $n^+$ implanted areas have been totally consumed.

Note also that layers 84 and 86 remain sufficiently thick to prevent any tunnel effect through these layers 84 and 86.

The parts of the very thin layers 74 and 76 on the flanks of the previously mentioned recesses are then naturally transformed into insulating layers with formula $SiO_xN_y$, marked as references 88 and 90 in FIG. 6.

This natural transformation is due to selective oxidation of the $n^+$ doped silicon.

Note that layers 88 and 90 are very thin, less than 2.5 mm, enabling a tunnel effect.

The thickness of layers 84 and 86 may be adjusted by $n^+$ doping and the oxidation conditions. For example if $n^+$ doping is 10E19 to 10E20/cm3 then a minimum thickness of 8 nm will be obtained by oxidation under steam at 850° C., while the thickness of layers 88 and 90 is 2.5 nm.

Obviously, these numeric values are examples that correspond to the materials considered. In general the tunnel effect for a material layer depends on the barrier height of this material and the layer thickness. The barrier height is known to the expert in the field, who will therefore be capable of determining a layer thickness enabling the tunnel effect through it (case of layers 88 and 90), or on the contrary a thickness preventing any tunnel effect through it (case of layers 84 and 86).

Figure 7:
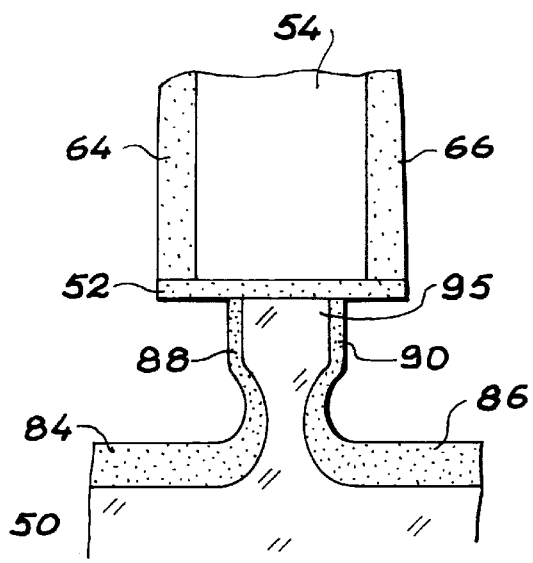
Figure 8:
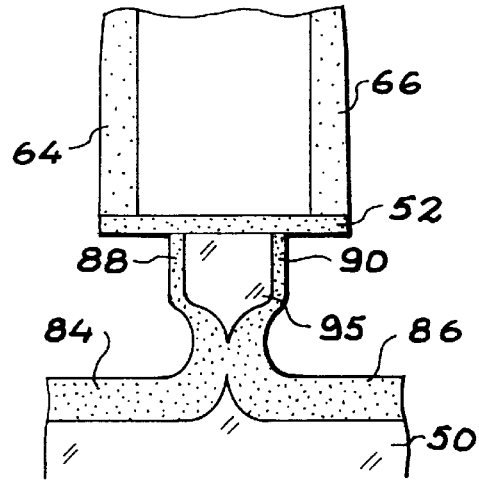
Figure 9:
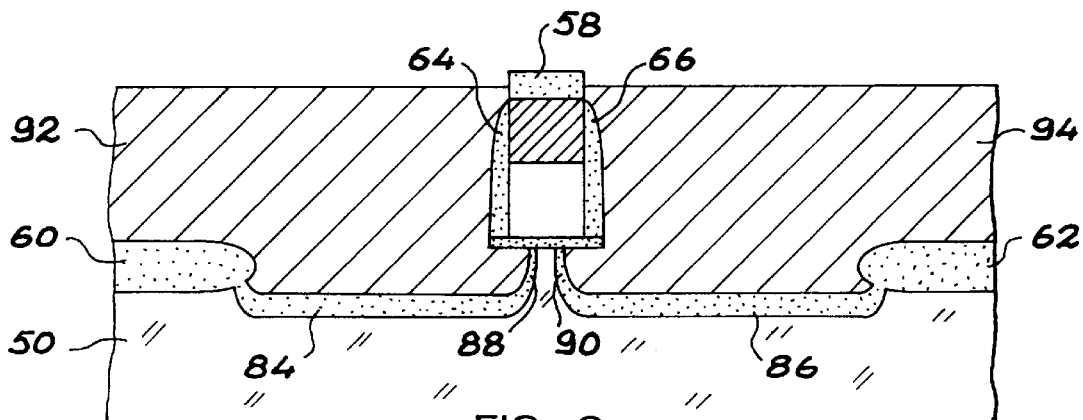

FIGS. 7 and 8 show two examples of the results obtained on "minimum" structures by adjusting the angle of inclination of the $n^+$ implantation beam, the dose, the implantation energy, the oxidation time and the grid size.

It is then possible to implant a p type doping ha, agent through the insulation on the flanks of the grid to compensate the n type doping which is obtained by diffusion of the $n^+$ implantation.

The source and drain areas 92 and 94 (FIG. 9) are then formed on each side of the grid area.

This is done preferably by depositing a metallic material on the structure obtained in FIG. 6, for example by chemical vapor deposition (CVD), this metallic material having an extraction potential that puts the Fermi level for this metallic material close to the middle of the prohibited silicon band.

This avoids the need to use two different metallic materials for implementing the invention, namely:

one metallic material to obtain an n channel transistor, corresponding to the case described with reference to FIGS. 3 to 9, and, another metallic material to obtain a p channel transistor, which requires the use of substrate 50 made of an n type silicon.

The metallic material thus deposited projects beyond the level of the insulating layer 58 made of $Si_3N_4$.

This metallic material is then polished, this layer 58 acting as a polishing stop layer.

This thus gives source and drain areas 92 and 94 without any contacts.

The metallic materials that represent the best compromise for making source and drain areas from an electronic point of view and from a technological point of view are made of tungsten, titanium nitride and titanium.

In one embodiment not shown, Schottky diodes are made, for example using platinum, gold and palladium on the n side, and titanium or aluminum on the p side.

This thus gives a MOS type transistor including a metal-insulator-semiconductor type structure in the direction from the transistor source to the channel, or from the drain to this channel, the insulation of this structure enabling a tunnel effect.

The channel region can only be accessed by charge carriers supplied by the transistor source passing the barrier-tunnel.

To return to FIGS. 7 and 8, the transistor channel 95 may be a volume slightly open to the substrate (FIG. 7) or a closed volume if this channel is short and does not exceed about 10 nm (FIG. 8).

In the case in FIG. 7, parasite currents can be removed from the substrate giving an SOI type structure under the source and drain areas with a slightly depleted volume.

In the case shown in FIG. 8, the structure obtained can be considered as a MOS type transistor on strongly depleted SOI.

Note that in the case shown in FIG. 7, the transistor channel can be polarized through the substrate.

The blocking voltage is controlled by the substrate in the same way as in a conventional MOS transistor.

Note that in the case shown in FIG. 7, the channel length exceeds about 10 nm.

In the case shown in FIG. 8, a quantum well is obtained in the transistor channel region.

This quantum well enables coulombian trapping of charge carriers by confinement.

It is thus possible to manufacture MOS transistors with a single carrier (single electron or single hole) in small structures.

We will now describe another process according to the invention, to make a MOS transistor with an SOI type structure, with reference to FIGS. 10 to 14.

Figure 2:
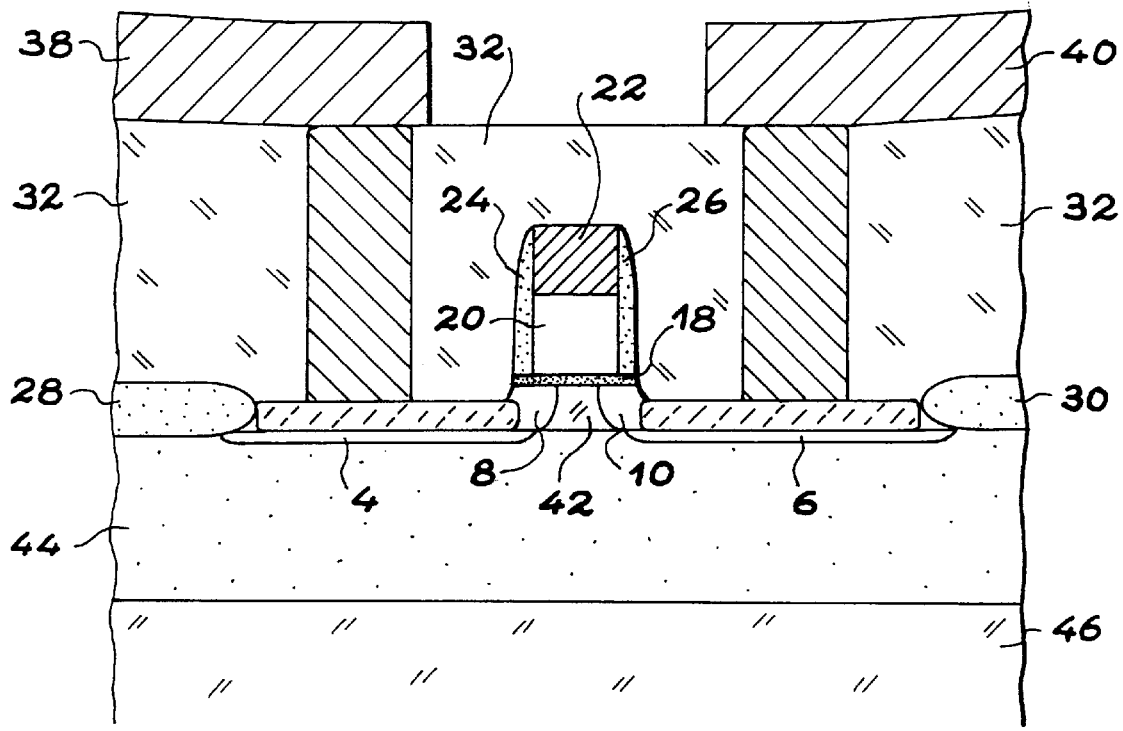

The structure of this transistor according to the invention can be compared with the structure of the transistor schematically shown in FIG. 2 already described.

This other manufacturing process is identical to the process according to the invention, and makes a MOS transistor on a solid semiconductor substrate (FIGS. 3 to 9), except for steps to make the source and drain insulation which is not necessary in this case.

This insulation is made naturally by the buried silicon oxide in the SOI type structure.

Figure 10:
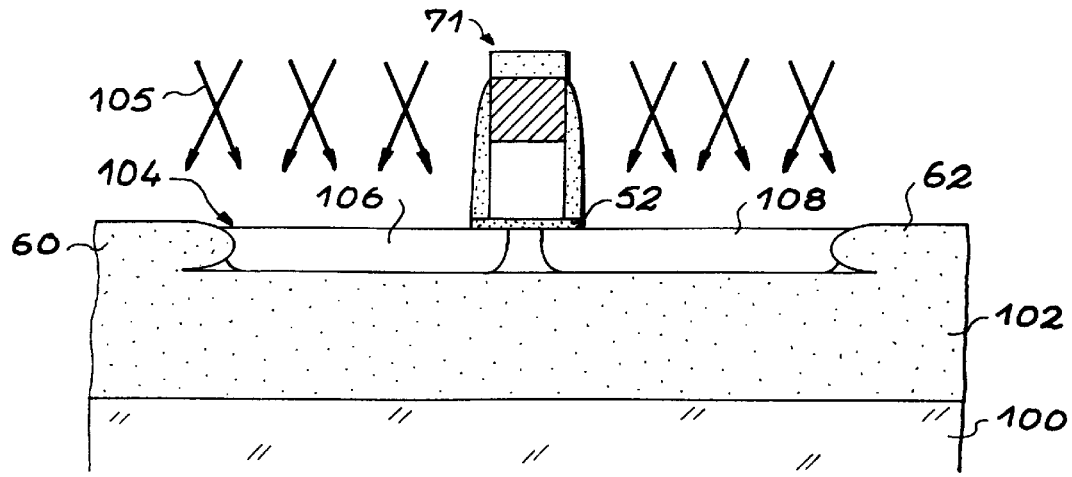
Figure 11:
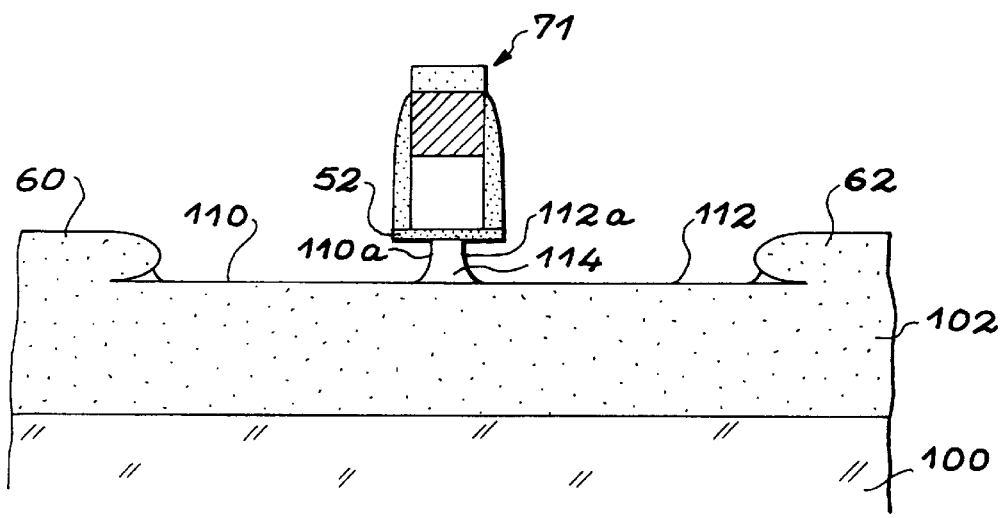

As shown in FIG. 10, the first step is to make this type of SOI structure in a known manner, comprising a substrate made of single crystalline silicon 100 on which a very thick layer of buried silica 102 is formed, itself covered by a layer of single crystalline silicon 104, of the p type in the example shown.

Layer 102 is-chosen to be sufficiently thick to prevent any direct tunnel effect through this layer 102.

On this structure, the grid area 71 described above with reference to FIG. 3 is formed in a known manner.

As described above, the field insulation areas 60 and 62 on each side of the grid area 71 are also formed, for example using the LOCOS method.

Recesses 110 and 112 are then formed (FIG. 11) in layer 104, these recesses extending as far as layer 102.

The recess 110 is between area 60 and the grid area 71 and the recess 112 is between the grid area and area 62.

There is a single crystalline silicon area 114 between these two recesses 110 and 112, which will contain the transistor channel being made.

As above, the recesses may be formed by isotropic etching of the silicon.

They may also be formed by firstly making a p+ implantation in areas 106 and 108 of the silicon layer 104 (these areas corresponding to areas 67 and 69 in FIG. 3) using an appropriate ion beam 105, the substrate being inclined and rotated during this implantation as described above.

An implantation annealing is then done, and the source and drain residual oxide is then eliminated.

A selective etching of the p+ doped silicon areas is then done.

Figure 12:
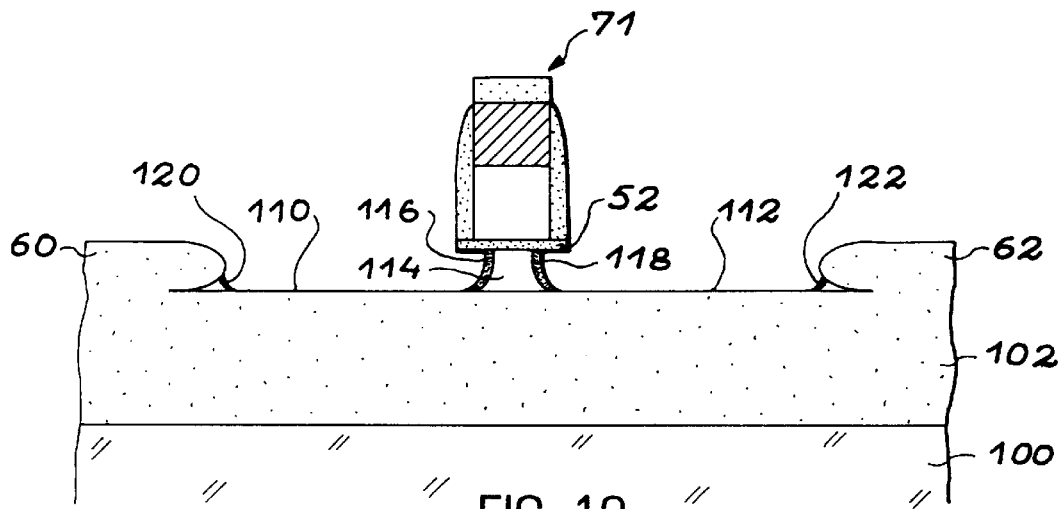

As shown in FIG. 12, very thin layers 116 and 118 with a thickness for example of the order 1 nm, are then formed on flanks 110a and 112a of recesses 110 and 112, which are located under the grid oxide layer 52.

These layers may be made of silicon nitride and are then formed by fast thermal nitridation of the silicon area 14.

They may also be made of silica and are then formed by fast oxidation of the silicon area 114.

These very thin layers 116 and 118 correspond to the parts of layers 74 and 76 in FIG. 5 remaining on the flanks of recesses.

FIG. 12 also shows very small layers 120 and 122 that are formed in the silicon, on the side of the field insulation areas 60 and 62 respectively.

Figure 13:
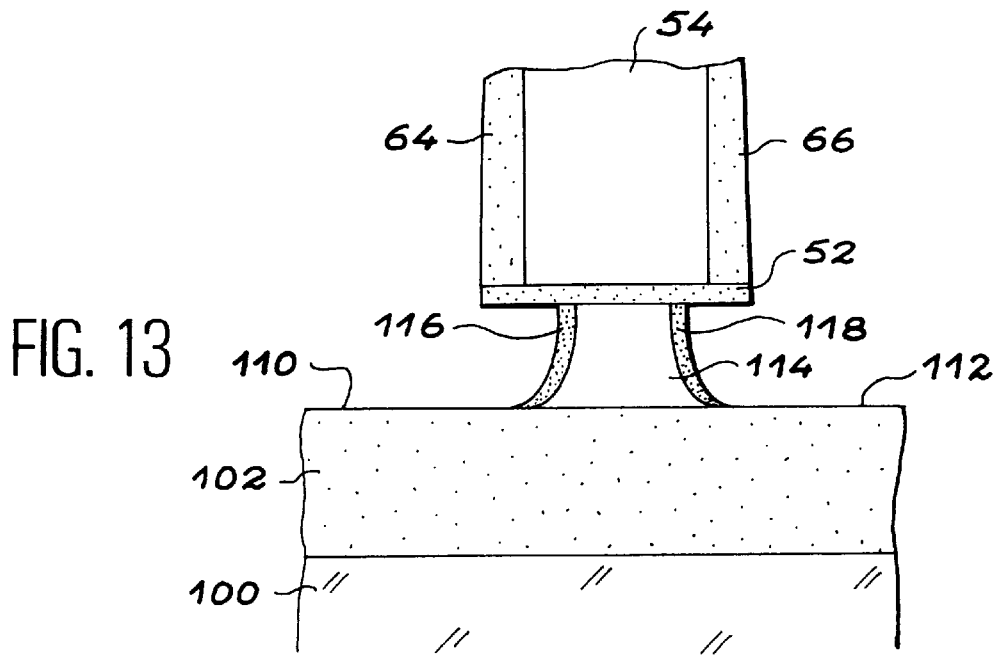

FIG. 13 is an enlarged view of the channel area 114 of the transistor that is currently being formed.

This channel area 114 is separated from recesses 110 and 112 which are designed to hold the source and drain areas, by the very thin insulating layers 116 and 118.

This channel area 114 forms a volume that is electrically inaccessible from substrate 100.

This channel area 114 of the transistor forms a quantum well.

Figure 14:
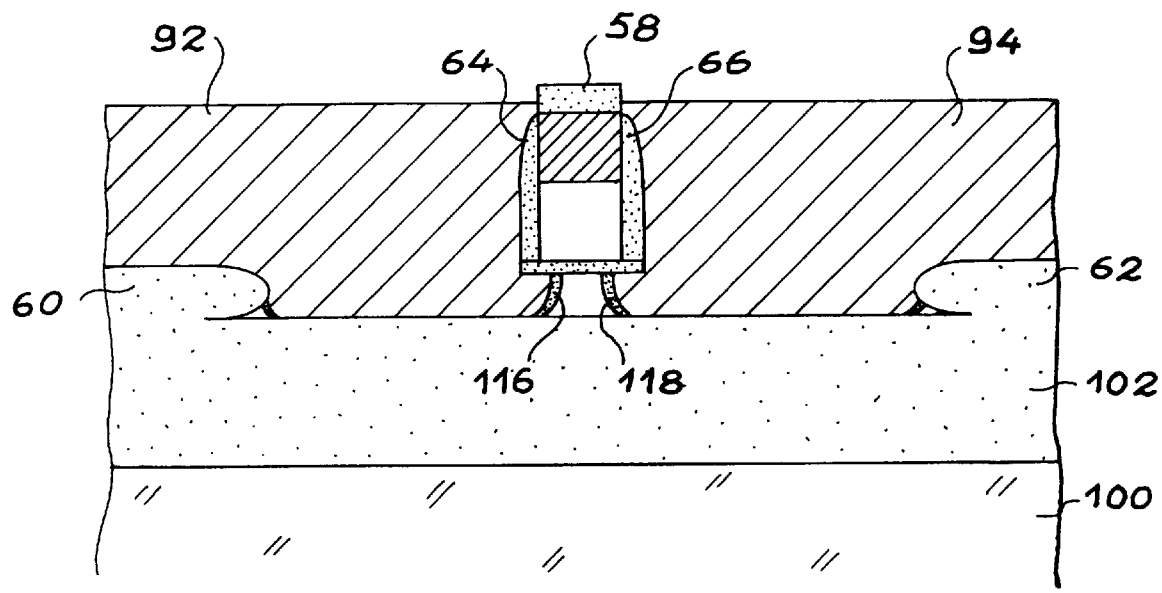

FIG. 14 schematically illustrates another step in the formation of the transistor.

As described above, this other step consists of depositing a metallic material, for example by chemical vapor deposition, on the structure in FIG. 12, until this material projects above the level of the insulating layer 58.

The deposited metallic material is then polished, this insulating layer 58 acting as a polishing stop layer.

This thus gives the source and drain areas 92 and 94.

FIGS. 15 to 19 schematically illustrate the steps in another process according to the invention, used to obtain a MOS transistor with a pseudo-SOI type structure.

In this other process, instead of using a differential oxidization effect of an n+ implanted layer with respect to the slightly doped silicon, local oxidation is used by depositing and etching a layer of silicon nitride.

More precisely, the first step is to form a structure identical to that shown in FIG. 4, by steps that are not shown.

Figure 15:
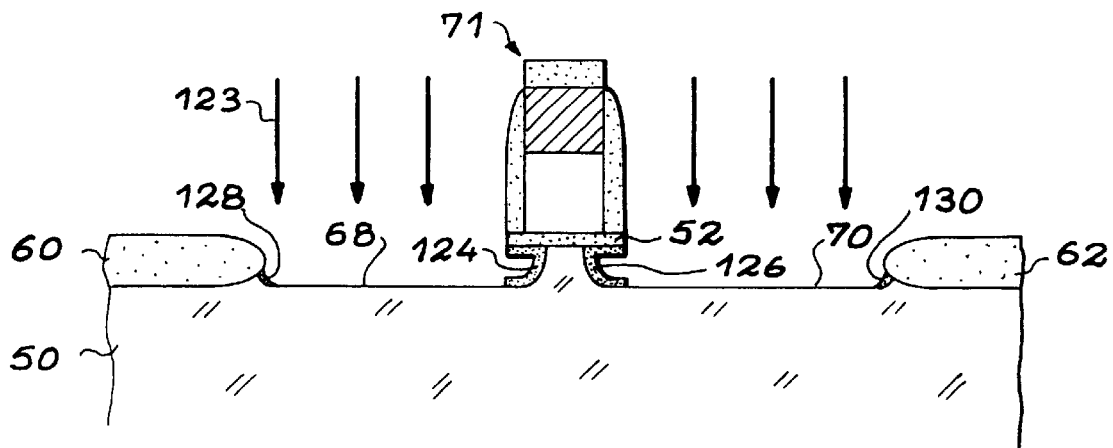

Then, as schematically illustrated by arrows 123 in FIG. 15, a thin deposition of silicon nitride is formed, for example by low pressure chemical vapor deposition in recesses 68 and 70 in this structure, particularly on the flanks of these recesses, which are located under layer 52.

The thickness of this deposition on these flanks is such that the passage of electrons in the active part of the transistor to be formed takes place by a tunnel effect.

For example, this thickness may be of the order of a few nanometers to 2.5 nanometers.

An anisotropic etching selective with respect to the silicon is then done, self aligned on the grid.

FIG. 15 shows the thin and insulating layers 124 and 126 that enable the tunnel effect, that remain on the flanks of the recesses considered above.

Note that the shading of the grid area 71 is used again during the deposition of silicon nitride and when etching this deposition.

FIG. 15 also shows very small layers of silicon nitride 128 and 130 that remain after the silicon nitride has been etched at the ends of the recesses at the side of the field insulation areas 60 and 62 respectively.

The silicon at the bottom of recesses 68 and 70 is then locally oxidized.

Figure 16:
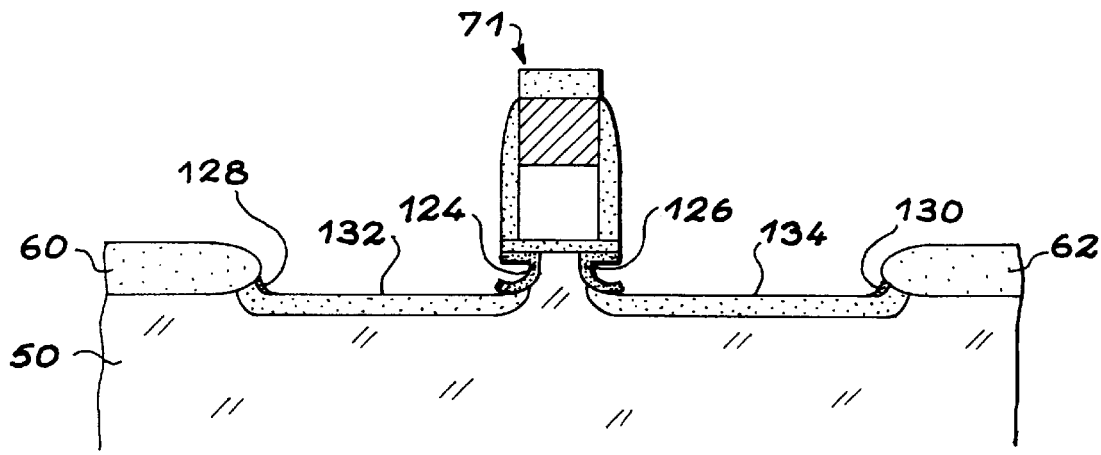

The localized silicon layers thus obtained are marked as references 132 and 134 in FIG. 16.

The thickness of these areas 132 and 134 is such that:

no direct tunnel effect through these layers 132 and 134 is possible, and the silicon nitride layers 124 and 128 are not completely consumed.

Figure 17:
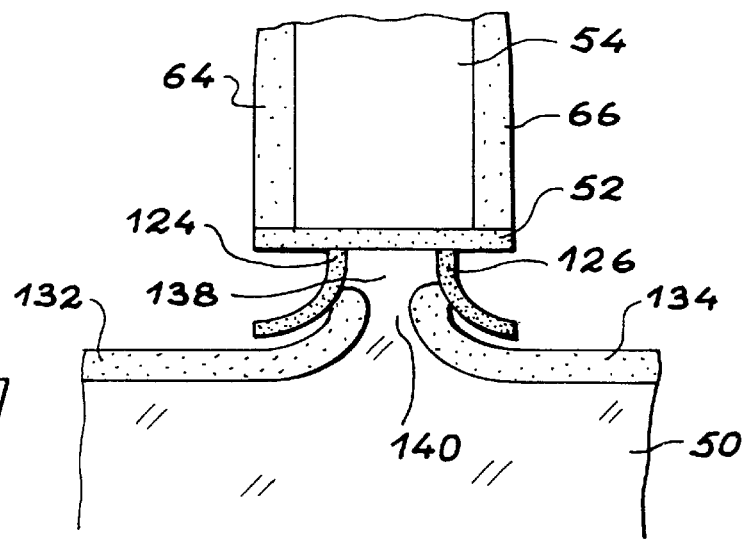
Figure 18:
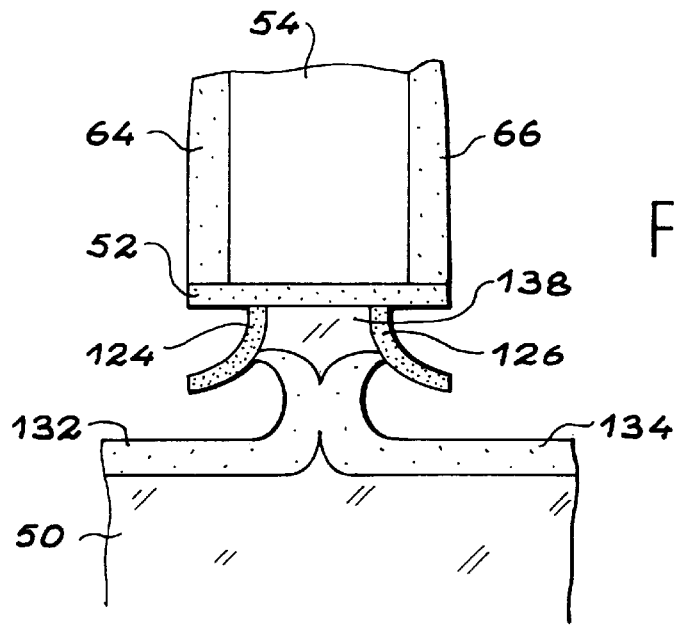

FIGS. 17 and 18 (corresponding to FIGS. 7 and 8 respectively) show the single crystalline silicon volume 138 that will contain the transistor channel.

This volume 138 is delimited by very thin layers 124 and 128 enabling the tunnel effect.

In the case shown in FIG. 17, this volume communicates with the substrate 50 made of single crystalline silicon through a very narrow area of this substrate.

This very narrow area is delimited by the ends of layers 132 and 134, which face each other under layer 52.

This communication enables the formation of a MOS transistor controlled by means of substrate 50.

In the case shown in FIG. 18, the volume of silicon 138 in which the transistor channel will be contained is electrically insulated from substrate 50.

This volume 138 is also delimited by the very thin layers 124 and 126, and can be used to produce a quantum well.

Figure 19:
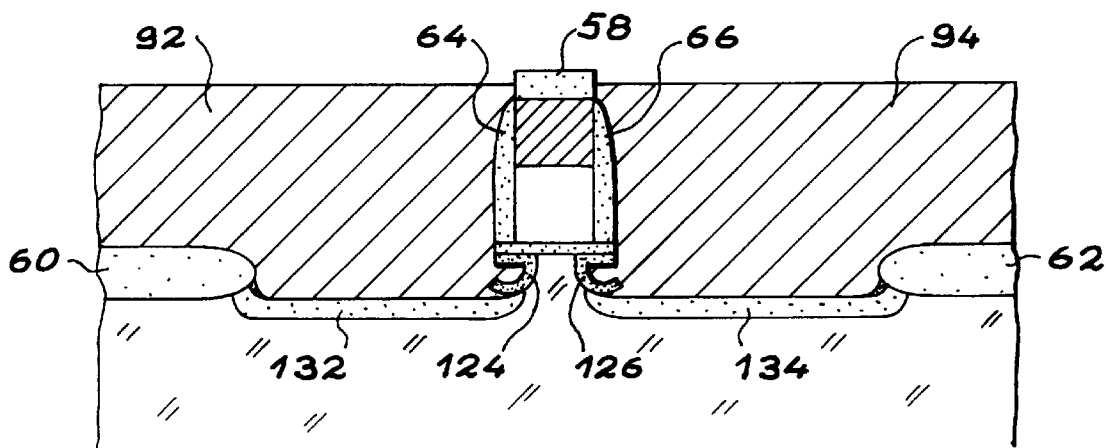

FIG. 19 schematically illustrates the formation of the transistor source and drain areas 92 and 94.

This formation takes place by depositing a metallic material and then polishing it as far as the insulating layer 58 (which acts as a stop layer for the polishing) as explained above.

As a variant, after the formation of the silicon layers 132 and 134 (FIG. 16) the silicon nitride parts 124, 126, 128 and 130 that remain can be selectively removed from the silica and the silicon, using a solution of peroxosulfuric acid.

This procedure is described in the following document:

(3) S. Deleonibus et al. JEPC December 1991, pages 3739 to 3742.

The silicon is then locally and quickly oxidized on the flanks of the recesses described above.

Figure 20:
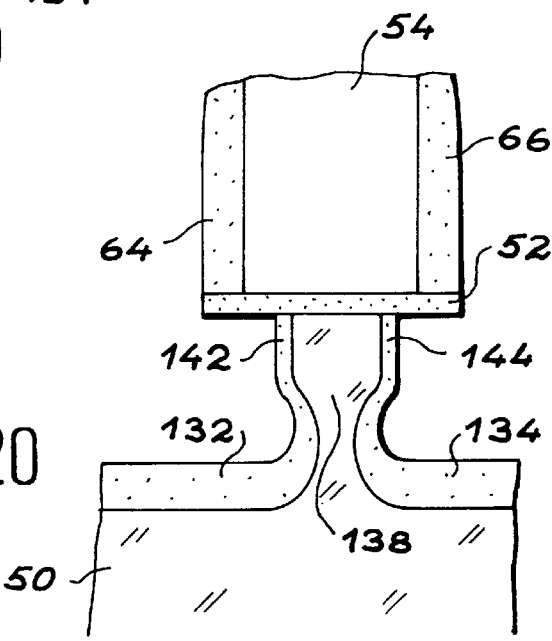
Figure 21:
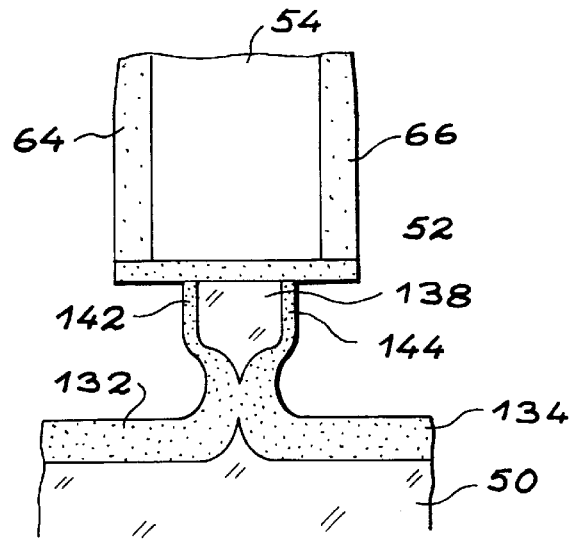

This variant is schematically illustrated in FIGS. 20 and 21 which correspond to FIGS. 17 and 18 respectively.

These FIGS. 20 and 21 show the very thin silicon oxide layers 142 and 144 that are obtained by this selective oxidation (and which replace the silicon nitride layers 124 and 126).

These very thin layers 142 and 144 still allow a tunnel effect.

FIGS. 20 and 21 also show the volume of silicon 138 in FIGS. 17 and 18 which is delimited by the very thin layers-142 and 144.

Figure 22:
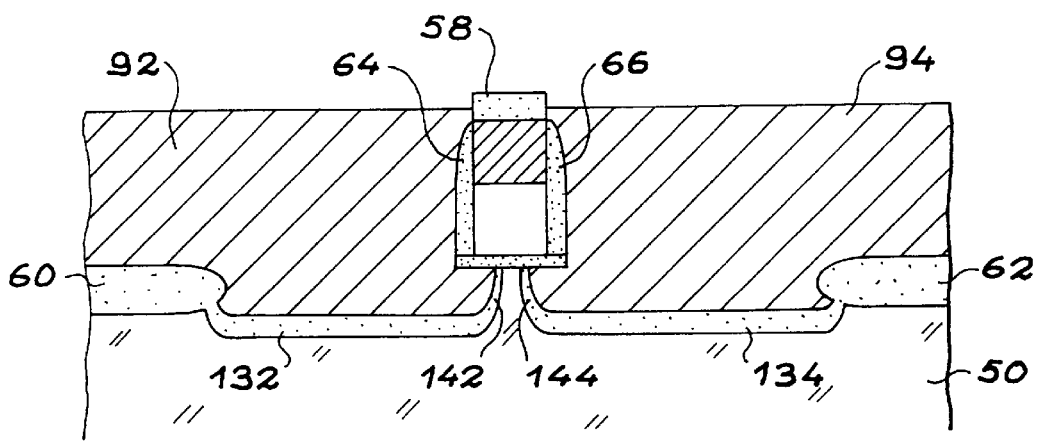

FIG. 22 schematically illustrates completion of the transistor resulting from the process corresponding to FIGS. 20 and 21 (metallic material deposition enabling the formation of the source and drain areas 92 and 94).

Figure 23:
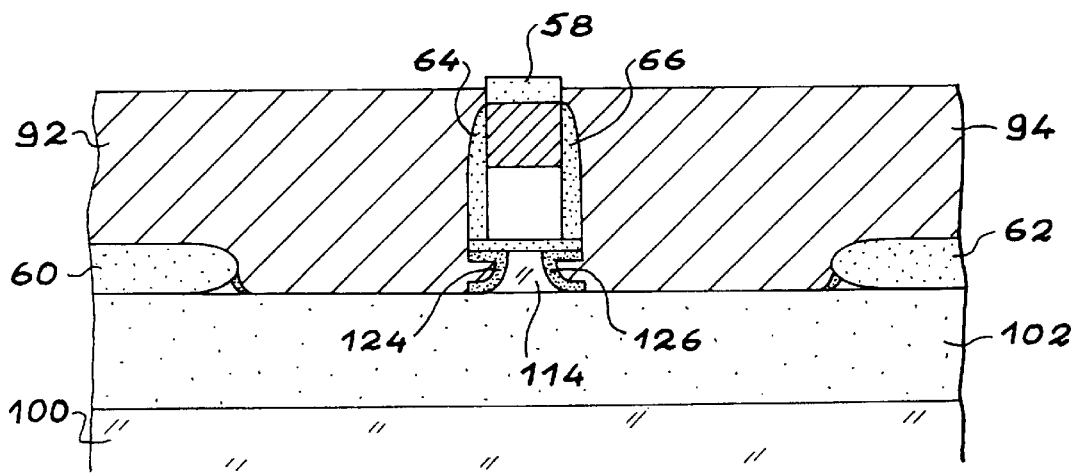

FIG. 23 is a schematic cross-sectional view of another transistor according to the invention, formed on an SOI type structure.

More precisely, this transistor in FIG. 23 is obtained as described with reference to FIGS. 15 to 19, or by using the variant explained in the description of FIGS. 20 and 21, except that local oxidation used for the formation of layers 132 and 134 is not necessary if an initial SOI structure is used.

Therefore, the metallic material is deposited by chemical vapor deposition after the silicon nitride has been selectively etched with respect to the silica.

FIG. 23 shows the silicon substrate 100, the buried silica layer 102, the area of the silicon channel 114 and the source and drain areas 92 and 94 that are separated from the channel area 114 by very thin layers of silicon nitride 124 and 126.

Obviously, a grid contact is formed afterwards to complete the transistor in all given examples.

Furthermore in these examples, p type silicon was used for the substrate in the pseudo-SOI structures, or for the silicon layer in which the recesses are formed in SOI structures, but the invention obviously includes transistors and the corresponding manufacturing processes that use an n type silicon or any other appropriate semiconductor (of type n or p).

We will now give a specific example of an application to non-volatile memories of the MOS transistor according to the invention.

This application concerns transistors partially shown in FIGS. 8 and 18, for which the channel is a closed volume.

Pseudo-SOI type structures shown in FIGS. 8 and 18 may be used as a non-volatile memory point.

By injecting electrons through the transistor source and by applying a positive polarization on the substrate 50, it is possible to store electrons in the substrate area 95 (FIG. 8) or 138 (FIG. 18), at the junction between the oxide layers 84, 86 (FIG. 8) and 132, 134 (FIG. 18) in the shape of a V.

The stress in this corner related to the intersection of the two lateral oxidation fronts induces charge states that are capable of trapping electrons provided that they leave the conducting channel.

This final condition is satisfied if substrate 50 is positively polarized.

The V shape substrate area 95 or 138 then acts as a storage capacitance for the memory point.

Its state of charge electrostatically influences the threshold voltage of the MOS transistor, in the same way as in a conventional non-volatile memory point.

What is claimed is:

1. MOS type transistor comprising:
    a semiconductor substrate,
    a grid area,
    a semiconductor channel located under the grid area and electrically insulated from it, and
    a source area and a drain area that are located on each side of the grid area and the channel and which are electrically insulated from the substrate and the grid area,
    said transistor being characterized in that the source and drain areas are separated from the channel by electrically insulating layers respectively that are sufficiently thin to enable charge carriers to pass by means of the tunnel effect from the source area to the drain area through the channel, and in that each of the source and drain areas is separated from the substrate by an electrically insulating layer sufficiently thick to prevent any passage of charge carriers through the insulating layer.

2. MOS type transistor according to claim 1, characterized in that each of the source and drain areas is made of a metallic material.

3. MOS type transistor according to claim, characterized in that the channel is electrically insulated from the substrate.

4. MOS transistor according to claim 1, characterized in that the channel is in electrical contact with the substrate through a narrow area of the substrate, which area is smaller than the channel.

5. MOS type transistor according to claim 1, characterized in that the substrate and the channel are made of silicon.

6. MOS type transistor according to claim 5, characterized in that the sufficiently thin insulating layers are made of silica.

7. MOS type transistor according to claim 5, characterized in that the sufficiently thin insulating layers are made of silicon nitride.

8. MOS type transistor according to claim 5, characterized in that the insulating layer that separates each of the source and drain areas of the substrate is a silica layer.

9. MOS type transistor according to claim 1, characterized in that the channel is separated from the substrate by a very thick electrically insulating layer, said insulating layer being sufficiently thick to prevent any direct tunnel effect through the layer.

10. Process for manufacturing the MOS type transistor according to claim 1, this process being characterized by the following steps:
    a structure is formed comprising a substrate, an active area and two field insulation areas on each side of the active area, and a grid area,
    two recesses are formed in the substrate, one between one of the field insulation areas and the grid area, and the other between the grid area and the other field insulation area, the flanks of the recesses closest to the grid area being located under the grid area,
    the sufficiently thin insulating layers are formed on the flanks and the sufficiently thick insulating areas are formed at the bottom of the recesses, and
    the source and drain areas are formed in the recesses.

11. Process according to claim 10 in which the substrate and the channel are made of silicon and the insulating layer that separates each of the substrate source and drain areas is a silica layer and the sufficiently thin insulating areas are formed first and the silica layers are then formed by doping substrate areas at the bottom of the recesses by impurities enabling fast oxidation of the substrate and then oxidizing the areas thus doped.

12. Process according to claim 11, characterized in that the sufficiently thin insulating layers are made of silica or silicon nitride.

13. Process according to claim 10 in which the substrate and the channel are made of silicon and the insulating layer that separates each of the substrate source and drain areas is a silica layer and the sufficiently thin insulating layers and the silica layers are formed by depositing silicon nitride in the recesses, the nitride thus deposited is eliminated except on the flanks so as to form the sufficiently thin insulating layers, and the substrate areas at the bottom of the recesses are oxidized so as to form the silica layers.

14. Process according to claim 10 in which the substrate and the channel are made of silicon and the insulating layer that separates each of the substrate source and drain areas is a silica layer and the sufficiently thin insulating layers and the silica layers are formed by depositing silicon nitride in the recesses, eliminating the nitride thus depositing except on the flanks, the substrate areas at the bottom of the recesses are oxidized so as to form the silica layers, the nitride from the flanks is eliminated and these flanks are oxidized so as to form the sufficiently thin insulating layers.

15. Process for manufacturing the MOS type transistor according to claim 9, the process being characterized by the following steps:

a structure is formed comprising the substrate, a very thick insulating layer, a semiconductor layer above the very thick insulating layer, an active area and two field insulation areas on each side of the active area, and the grid area, two recesses are formed in the semiconductor layer, one between one of the field insulation areas and the grid area, and the other between the grid area and the other field insulation area, the flanks of the recesses closest to the grid area being located under the grid area, the sufficiently thin layers are formed on the flanks, and the source and the drain areas are formed in the recesses.

16. Process according to claim 15 in which the substrate and the channel are made of silicon, and the very thick layer is made of silica, characterized in that the sufficiently thin insulation layers are made of silica or silicon nitride.

17. Process according to claim 15 in which the substrate and the channel are made of silicon, and the very thick layer is made of silica characterized in that the sufficiently thin insulation layers are formed by depositing silicon nitride in the recesses, and the nitride thus deposited is eliminated except on the said flanks.

18. MOS Type transistor according to claim 1 further comprising a non-volatile memory, the channel of said transistor being a closed volume.

* * * * *

UNITED STATES PATENT AND TRADEMARK OFFICE
CERTIFICATE OF CORRECTION

PATENT NO.    : 6,091,076
DATED         : July 18, 2000
INVENTOR(S)   : Deleonibus It is certified that error appears in the above-identified patent and that said Letters Patent is hereby corrected as shown below:

Claim 3, column 11,
Line 65, after "claim" insert -- 1 --.

Signed and Sealed this

Eighteenth Day of September, 2001

Attest:

NICHOLAS P. GODICI
Attesting Officer    Acting Director of the United States Patent and Trademark Office